(12) United States Patent
Oren et al.

(10) Patent No.: US 12,392,733 B2
(45) Date of Patent: Aug. 19, 2025

(54) COMBINED OCD AND PHOTOREFLECTANCE METHOD AND SYSTEM

(71) Applicant: NOVA LTD., Rehovot (IL)

(72) Inventors: Yonatan Oren, Kiryat Ono (IL); Gilad Barak, Rehovot (IL)

(73) Assignee: NOVA LTD., Rehovot (IL)

( * ) Notice: Subject to any disclaimer, the term of this patent is extended or adjusted under 35 U.S.C. 154(b) by 152 days.

(21) Appl. No.: 17/758,067

(22) PCT Filed: Dec. 24, 2020

(86) PCT No.: PCT/IL2020/051331
§ 371 (c)(1),
(2) Date: Jun. 27, 2022

(87) PCT Pub. No.: WO2021/130757
PCT Pub. Date: Jul. 1, 2021

(65) Prior Publication Data
US 2023/0035404 A1  Feb. 2, 2023

Related U.S. Application Data

(60) Provisional application No. 62/953,640, filed on Dec. 26, 2019.

(51) Int. Cl.
*G01N 21/956* (2006.01)
*G01B 11/02* (2006.01)
(Continued)

(52) U.S. Cl.
CPC .......... *G01N 21/956* (2013.01); *G01B 11/02* (2013.01); *G01N 21/9501* (2013.01);
(Continued)

(58) Field of Classification Search
CPC ............ G03F 7/70605; G03F 7/70608; G03F 7/70616; G03F 7/70625; G03F 7/70653;
(Continued)

(56) References Cited

U.S. PATENT DOCUMENTS

| | | | | |
|---|---|---|---|---|
| 6,891,610 B2* | 5/2005 | Nikoonahad | ....... | G03F 7/70633 356/73 |
| 6,963,401 B2* | 11/2005 | Opsal | ................... | G01N 21/211 356/369 |
| 7,016,044 B2* | 3/2006 | Murtagh | ................ | B82Y 10/00 356/432 |

(Continued)

FOREIGN PATENT DOCUMENTS

JP  2002340675 A  * 11/2002

*Primary Examiner* — Gordon J Stock, Jr.
(74) *Attorney, Agent, or Firm* — Reches Patents

(57) ABSTRACT

A combined OCD and photoreflectance system and method for improving the OCD performance in measurements of optical properties of a target sample. The system comprises (a) either a single channel OCD set-up comprised of a single probe beam configured in a direction normal/oblique to the target sample or a multi-channel OCD set-up having multiple probe beams configured in normal and oblique directions to the target sample for measuring the optical properties of the target sample, (b) at least one laser source for producing at least one laser beam, (c) at least one modulation device to turn the at least one laser beam into at least one alternatingly modulated laser beam, and (d) at least one spectrometer for measuring spectral components of the at least one light beam reflecting off said target sample; wherein the at least one alternatingly modulated laser beam is alternatingly modulating the spectral reflectivity of the target sample.

15 Claims, 8 Drawing Sheets

(51) Int. Cl.
 *G01N 21/88* (2006.01)
 *G01N 21/95* (2006.01)
 *G03F 7/00* (2006.01)
 *H01L 21/66* (2006.01)

(52) U.S. Cl.
 CPC .......... *G03F 7/70625* (2013.01); *H01L 22/12* (2013.01); *G01N 2021/8835* (2013.01)

(58) Field of Classification Search
 CPC .......... G03F 7/70681; G03F 7/706831; G03F 7/706843; G03F 7/706847; G03F 7/706849; G03F 7/706851; G01B 11/02; H01L 22/12; H01L 22/20; G01N 2021/8835; G01N 21/25; G01N 21/9501; G01N 21/956
 See application file for complete search history.

(56) References Cited

U.S. PATENT DOCUMENTS

| | | | |
|---|---|---|---|
| 7,099,007 B2 * | 8/2006 | Hovinen | G01N 21/171 356/369 |
| 7,239,390 B2 † | 7/2007 | Smith | |
| 7,280,215 B2 * | 10/2007 | Salnik | G01N 21/636 356/432 |
| 7,286,243 B2 | 10/2007 | Rosencwaig | |
| 7,349,090 B2 * | 3/2008 | Wack | G03F 7/70708 356/369 |
| 7,616,307 B2 * | 11/2009 | Murtagh | G01N 21/1717 356/326 |
| 7,616,308 B2 * | 11/2009 | Murtagh | G01N 21/1717 356/326 |
| 7,659,979 B2 * | 2/2010 | Murtagh | G01N 21/9501 356/442 |
| 7,755,752 B1 * | 7/2010 | Salnik | H01L 22/12 356/237.2 |
| 7,982,867 B2 * | 7/2011 | Salnik | G01N 21/1717 356/237.2 |
| 8,049,903 B2 * | 11/2011 | Opsal | G01B 11/0641 356/369 |
| 8,982,339 B2 | 3/2015 | Schönleber et al. | |
| 9,746,310 B2 * | 8/2017 | Hung | H01L 21/823431 |
| 9,879,977 B2 | 1/2018 | Shchegrov | |
| 11,802,829 B2 * | 10/2023 | Oren | G01N 21/25 |

\* cited by examiner
† cited by third party

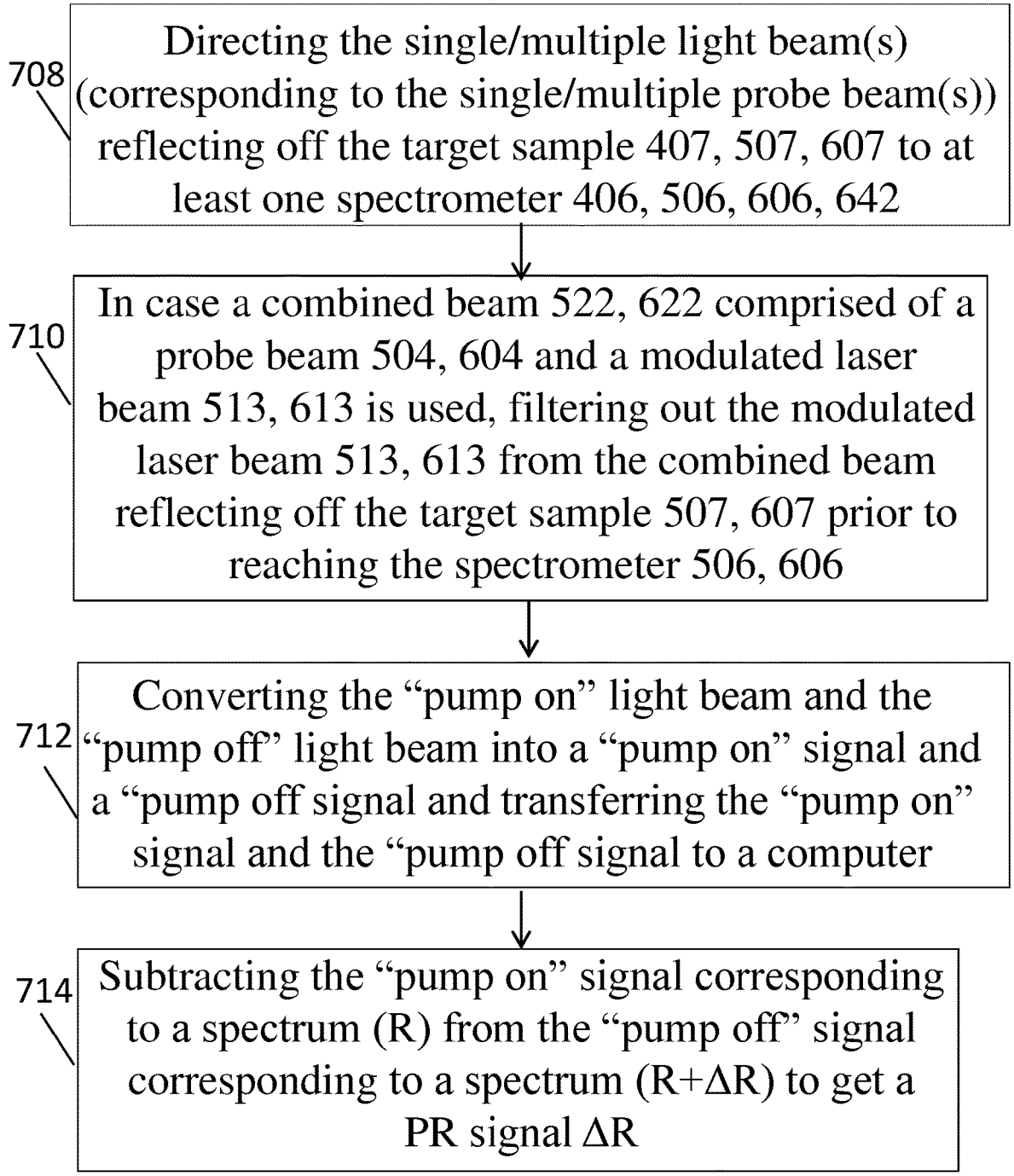
Fig. 7 (continue)

COMBINED OCD AND PHOTOREFLECTANCE METHOD AND SYSTEM

FIELD OF THE INVENTION

The present invention relates to semiconductor measurement techniques. More specifically, the present invention relates to semiconductor metrology techniques for measurement of device critical dimensions by optical means.

BACKGROUND OF THE INVENTION

OCD (Optical Critical Dimension) is a subset of semiconductor metrology techniques for in-line measurement of device critical dimensions by optical spectroscopic methods (most commonly Spectral Ellipsometry or Spectral Reflectometry).

Since relevant dimensions of semiconductor devices are well below the diffraction limit of UV-Visible light, optical microscopy can't directly measure them. Instead, OCD is a model-based technique which works in the following way:
- Spectra of the structure to be analyzed are measured (preferably at multiple angles of incidence, polarizations etc.);
- A parametrized geometric model is built with enough degrees of freedom to closely represent the structure;
- Theoretical spectra based on that model are calculated using detailed electromagnetic simulation; and
- The model parameters are iteratively altered until best match is obtained between the theoretical and measured spectra.

For many years, OCD has been the workhorse of semiconductor fab inline metrology due to advantages thereof over other techniques—it is fast, non-destructive, non-contact and does not require a vacuum or any other special treatment of the sample. It's main weakness, however, lies in its indirect nature—the results can be affected by uncertainties in the model fidelity, calculation errors, optical system parameters, and material optical properties. Some of these concerns can be mitigated by improvements in hardware and software, but some are more fundamental.

The calculation of a theoretical spectrum from model parameters is commonly accomplished through standard electromagnetic modeling engines (such as Rigorous Coupled Wave Analysis). However, the process of interpreting the measured data to deduce the underlying structural parameters is highly challenging its eventual performance (precision, accuracy) is determined by the spectral sensitivity to the dimensional parameters of interest and the correlations between the spectral impact of variations of different parameters. Parameters with weak spectral effect, or parameters for which this effect is highly similar to the changes induced by variations of other parameters, would suffer from poor interpretation performance.

Such issues are increasingly plaguing OCD in direct correlation to the shrinking dimensions and increasing geometric and material complexity encountered in advanced semiconductor technology nodes.

One class of such problems is related to optical contrast—adjacent parts of the structure which are made of different, but optically similar, materials. As an illustration, consider for example a thin film of low Ge concentration Silicon-Germanium over Silicon. The two materials can have very different physical (e.g. electrical) properties while having quite similar optical permittivity. The spectrum will then be weakly sensitive to the film thickness, essentially seeing both materials as the same.

As another very common example, characterization of an ultra-thin film deposited over some complicated structure is needed. It is commonly extremely difficult to separate out the weak spectral sensitivity to this layer, from the (significantly stronger) influences of other dimensional parameters.

It is, therefore, an aim of the present invention to provide a system and method for in-line measurement of device critical dimensions. A system and method suitable to the shrinking dimensions and increasing geometric and material complexity encountered in advanced semiconductor technology nodes.

SUMMARY OF THE INVENTION

The present invention provides a system and method for improving the performance of OCD in challenging applications. More specifically, the present invention provides a system and method for in-line measurement of device critical dimensions, a combined OCD and photoreflectance (PR) system and method suitable to the shrinking dimensions and increasing geometric and material complexity encountered in advanced semiconductor technology nodes. In accordance with some embodiments of the present invention, photoreflectance (PR) spectroscopy offers a unique way to selectively change the sensitivity to different materials and thus highlight some parameters or break correlations between parameters. The reason for this is two-fold:
- PR response is strongly material dependent. For a given pump wavelength, some materials will experience PR while others will be completely unaffected.
- The PR spectrum of semiconductors is usually highly localized in frequency, with sharp features located at the band structure critical point energies. This also can help with decoupling the contributions from different materials.

In accordance with some embodiments of the present invention, there is thus provided a combined OCD and photoreflectance apparatus for improving the OCD performance in measurements of optical properties of a target sample.

The combined OCD and photoreflectance apparatus comprising:
(a) either a single channel OCD set-up comprised of a single probe beam configured in a direction normal/oblique to the target sample or a multi-channel OCD set-up having multiple probe beams configured in normal and oblique directions to the target sample for measuring the optical properties of the target sample in said normal direction and/or in said oblique direction;
(b) at least one laser source for producing at least one laser beam;
(c) at least one modulation device to turn the at least one laser beam into at least one alternatingly modulated laser beam, and thus, to allow said alternatingly modulated laser beam to alternatingly modulate the spectral reflectivity of the target sample, so that, a light beam reflecting off said target sample is alternatingly a "pump on" light beam and a "pump off" light beam; and
(d) at least one spectrometer for measuring spectral components of the at least one light beam reflecting off said target sample;

wherein said at least one light beam that is reflecting off the target sample is directed into said at least one spectrometer, and wherein said at least one alternatingly modulated laser beam is alternatingly modulating the spectral reflectivity of the target sample.

Furthermore, in accordance with some embodiments of the present invention, the modulating device directly modulating the at least one laser source or in a path of said at least one laser beam to produce at least one modulated laser beam. Furthermore, in accordance with some embodiments of the present invention, the multi-channel OCD set-up is comprised of a first probe beam configured in a direction normal to the target sample and a second probe beam configured in a direction that is oblique to the target sample.

Furthermore, in accordance with some embodiments of the present invention, the single/multiple probe beams) and the laser beam are directed to hit a single spot on said target sample.

Furthermore, in accordance with some embodiments of the present invention, the combined OCD and photoreflectance apparatus further comprises an optical element directing a pre-determined portion of either the single probe beam or at least one of the multiple probe beams onto the target sample.

Furthermore, in accordance with some embodiments of the present invention, the optical element is selected from a beam splitter and a mirror.

Furthermore, in accordance with some embodiments of the present invention, the combined OCD and photoreflectance apparatus further comprising at least one optical member for focusing either the single probe beam or at least one of the multiple probe beams onto the optical element.

Furthermore, in accordance with some embodiments of the present invention, the combined OCD and photoreflectance apparatus further comprising at least one optical member for focusing either the single probe beam or at least one of the multiple probe beams onto the target sample.

Furthermore, in accordance with some embodiments of the present invention, the combined OCD and photoreflectance apparatus further comprising at least one optical member for focusing either the single probe beam or at least one of the multiple probe beams onto the at least one spectrometer.

Furthermore, in accordance with some embodiments of the present invention, the combined OCD and photoreflectance apparatus further comprising a combiner to combine either the single probe beam or at least one of the multiple probe beams pith the at least one alternatingly modulated laser beam into a single beam prior to hitting the target sample.

Furthermore, in accordance with some embodiments of the present invention, the combined OCD and photoreflectance apparatus further comprising a notch filter/polarizer for filtering out the modulated laser beam from a combined beam reflecting off the target sample prior to entering into the spectrometer.

Furthermore, in accordance with some embodiments of the present invention, the combined OCD and photoreflectance apparatus further comprises an optical element directing a pre-determined portion of the combined beam onto the target sample.

Furthermore, in accordance with some embodiments of the present invention, the optical element is selected from a beam splitter and a mirror.

Furthermore, in accordance with some embodiments of the present invention, the combined OCD and photoreflectance apparatus further comprising at least one optical member for focusing the combined beam onto the optical element.

Furthermore, in accordance with some embodiments of the present invention, the combined OCD and photoreflectance apparatus further comprising at least one optical member for focusing the combined beam onto the target sample.

Furthermore, in accordance with some embodiments of the present invention, the combined OCD and photoreflectance apparatus further comprising at least one optical member for focusing the combined beam into the notch filter/polarizer.

Furthermore, in accordance with some embodiments of the present invention, there is thus provided a combined OCD and photoreflectance system for improving the OCD performance in measurements of optical properties of a target sample and for calculating light-induced change in optical properties of a target sample. The combined OCD and photoreflectance system comprising the above-described combined OCD and photoreflectance apparatus wherein the combined OCD and photoreflectance apparatus converting said "pump on" light beam and said "pump off" light beam to a "pump on" signal and a "pump off" signal and transferring said "pump on" signal and said "pump off" signal to a computer for subtracting the "pump on" signal corresponding to a spectrum (R) from the "pump off" signal corresponding spectrum (R+ΔR) to get a PR signal ΔR.

Furthermore, in accordance with some embodiments of the present invention, there is thus provided a combined OCD and photoreflectance method for measuring and calculating light-induced change in optical properties of a target sample. The method comprising:

(a) providing the above-described combined OCD and photoreflectance system;

(b) either focusing a single/multiple probe beam(s) in a direction normal and/or oblique to a spot on a target sample and a laser beam that is alternatingly modulated onto said spot on the target sample or focusing a combined beam comprised of a probe beam and a laser beam that is alternatingly modulated to a spot on said target sample;

(c) hitting said spot on the target sample either via said single/multiple probe beam(s) and said laser beam that is alternatingly modulated or via said combined beam to alternatingly modulate the reflectivity of the target sample, thus, to have "pump-on" light beam and "pump off" light beam alternatingly reflecting off the target sample;

(d) directing either a single/multiple light beam(s) or a combined beam comprised of a probe beam and a modulated laser beam reflecting off the target sample to at least one spectrometer;

(e) filtering out the modulated laser beam from the combined beam reflecting off the target sample prior to reaching the at least one spectrometer;

(f) converting the "pump on" light beam and the "pump off" light beam into a "pump on" signal and a "pump off signal and transferring the "pump on" signal and the "pump off signal to a computer; and (g) subtracting the "pump on" signal corresponding to a spectrum (R) from the "pump off" signal corresponding to a spectrum (R+ΔR) to get a PR signal ΔR.

Furthermore, in accordance with some embodiments of the present invention, the combined OCD and photoreflec-

DETAILED DESCRIPTION OF THE FIGURES

Figure 1:
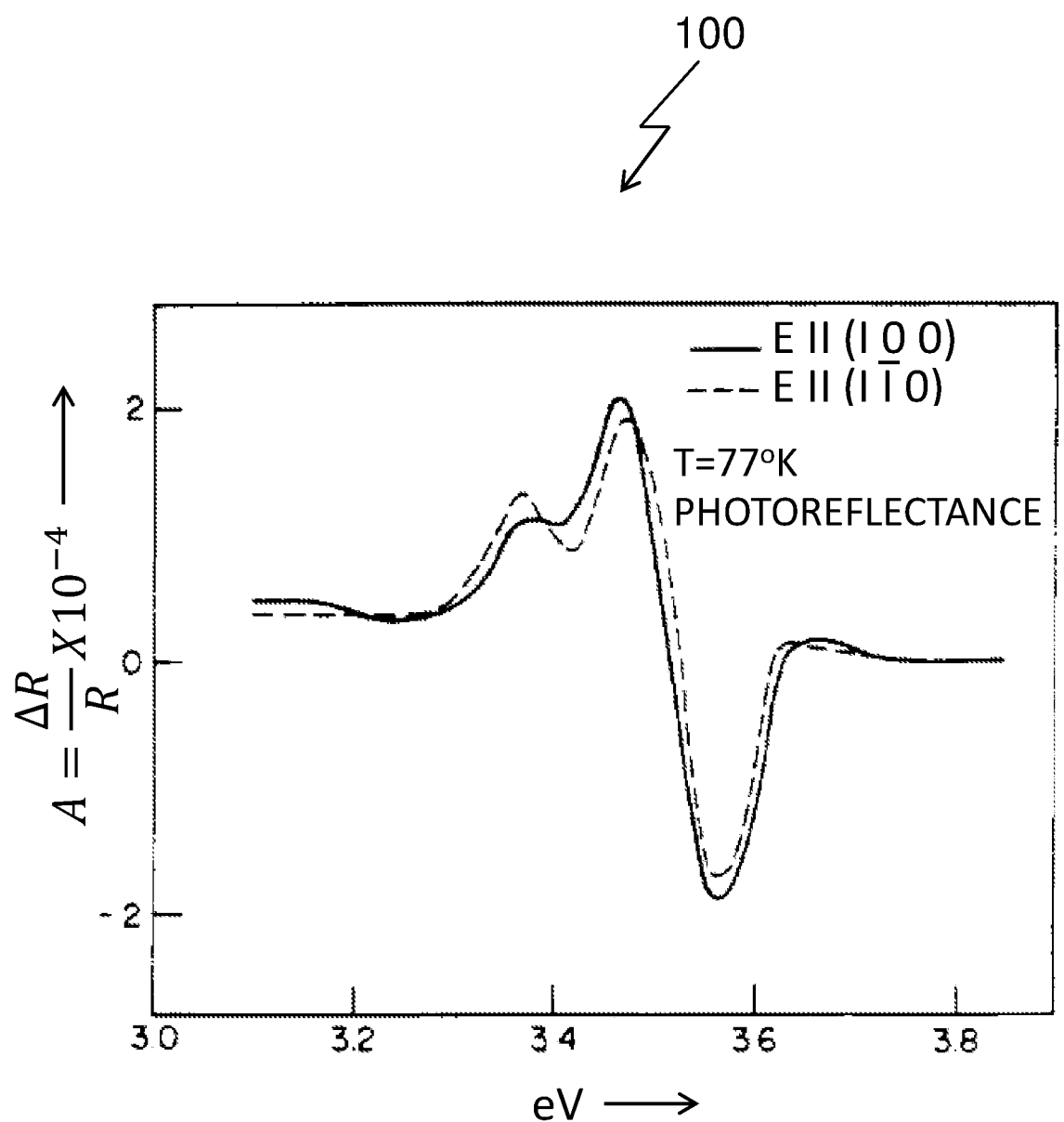
FIG. 1 is an example of PR spectrum of Silicon from 320 nm to 400 nm.

FIG. 1 is an Example of PR spectrum of Silicon from 320 nm to 400 nm.

In accordance with some embodiments of the present invention, it would seem beneficial to have a PR measurement channel working in conjunction with standard OCD, measuring the target sample at the same time and location so as to provide complementary spectral information. This information can be used in several ways:

Model-based—by including a theoretical model of the PR response into the spectrum calculation. Such modeling can include account for the multiple related effects, such as thermos-reflectance, electro-reflectance, magneto-reflectance, and even such considerations as charge carrier excitation and diffusion, band structure and photo-effects on the band structure, nonlinear responses etc.

In certain simple cases like thin films, the response at specific wavelengths can be directly correlated to film thickness, absorption or refractive index.

In more complicated cases, Machine Learning algorithms trained on controlled reference data can be employed, and would benefit from the increased sensitivities of PR.

The appeal of this approach also comes from the synergy between the two methods. The broadband spectroscopic measurement channel of an OCD tool is suited to serve as the probe in a PR system. To complete the system, a modulated pump beam needs to be inserted into the optical path and synchronized to the spectral acquisition electronics.

However, some details need to be considered for this to work. One such is the question of noise. One of the challenges of PR is the small relative modulation of the reflectance ($\Delta R/R \sim 10^{-4}-10^{-5}$) which requires reflectometry measurement at very high signal-to-noise ratios (SNRs) of the order of $\sim 10^{5-6}$. This is especially true in the context of integration with OCD systems which usually have SNR on the order of $\sim 10^{3-4}$ and are required to measure at less than ~1 second to maintain reasonable throughput. If PR is to be part of the OCD measurement, it also should conform to similar requirements.

A possible way to address this problem without completely redesigning the OCD system is to use a high brightness source such as a supercontinuum laser (SCL) or some types of laser-driven plasma sources.

As an illustration of typical numbers, achieving a shot noise limited SNR of $10^5$ requires each pixel in the sensor to accumulate $>10^{10}$ photoelectrons (i.e., $\sim 10^{3-4}$ times more light than a typical OCD measurement, at a similar acquisition time). To achieve this in a span of 1 s, the product of frame rate to full well capacity (FWC) is $\sim 10^{10} e^-/s$.

Practical values based on current sensor and electronics technology are frame rates of $\sim 10^{2-3}$ PPS and FWC of $\sim 10^{7-8} e^-$, which are achievable with linear array CCDs. By combining this sort of acquisition system with a high brightness source such as a SCL, the SNR and throughput requirements can be met.

Another issue in PR spectroscopy is contamination of the probe beam by the much brighter pump beam, either directly or through stray light. In this context, a key parameter of OCD tool design is the number of angles of incidence (AOIs), which mostly come in two flavors:

Normal Incidence channel: usually found in integrated metrology tools that need to have a small footprint. Single objective lens serves both illumination and collection.

Multichannel (Normal and Oblique Incidence channels): usually found in stand-alone metrology tools. Separate objectives are used for the oblique illumination and collection of the reflected beam.

Bringing the pump and probe beam together on the target sample can be implemented in several ways depending on the system design:

Noncolinear: The most straightforward way to separate the pump and probe beams is by using different AOIs, geometrically separating them at the detector plane as illustrated below in FIG. 4. This requires focus and boresight matching of the two beams.

In multichannel tools, this can be achieved by using one of the channels (normal or oblique) for the pump and the other for the probe beams. Alternatively, the pump light can be inserted obliquely from outside the objective in a normal-only design. This however requires a more substantial modification of the system to accommodate.

Another option is to use a normal channel with large-NA objective, and illuminate only the central part of the entrance pupil by the probe beam and the outer ring by the pump, allowing them to be easily separated in the collection channel by using suitable apertures.

Figure 5:
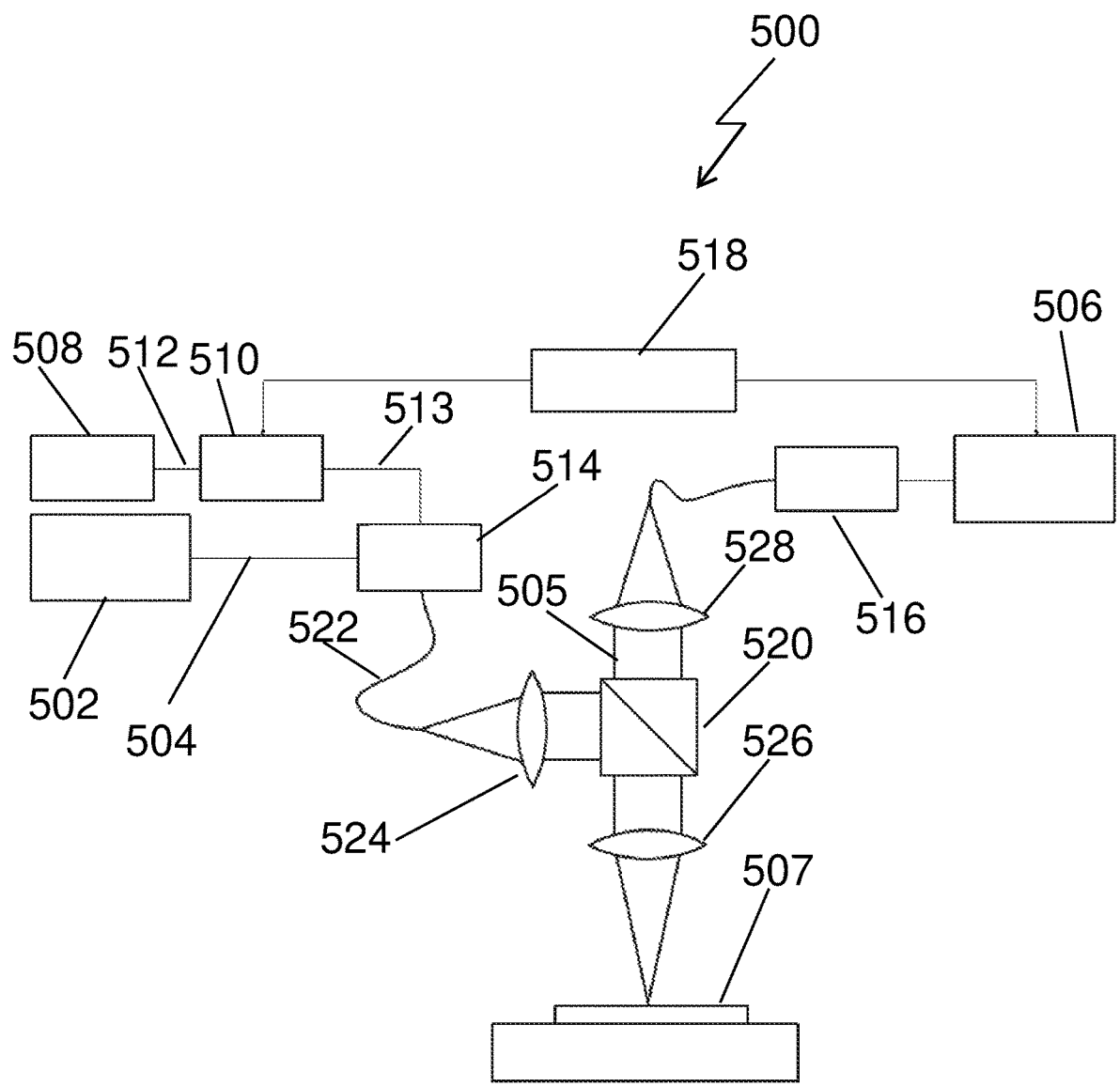
FIG. 5 illustrates an alternative combined OCD and Photoreflectance (PR) spectroscopy apparatus in accordance with some embodiments of the present invention.
Figure 6:
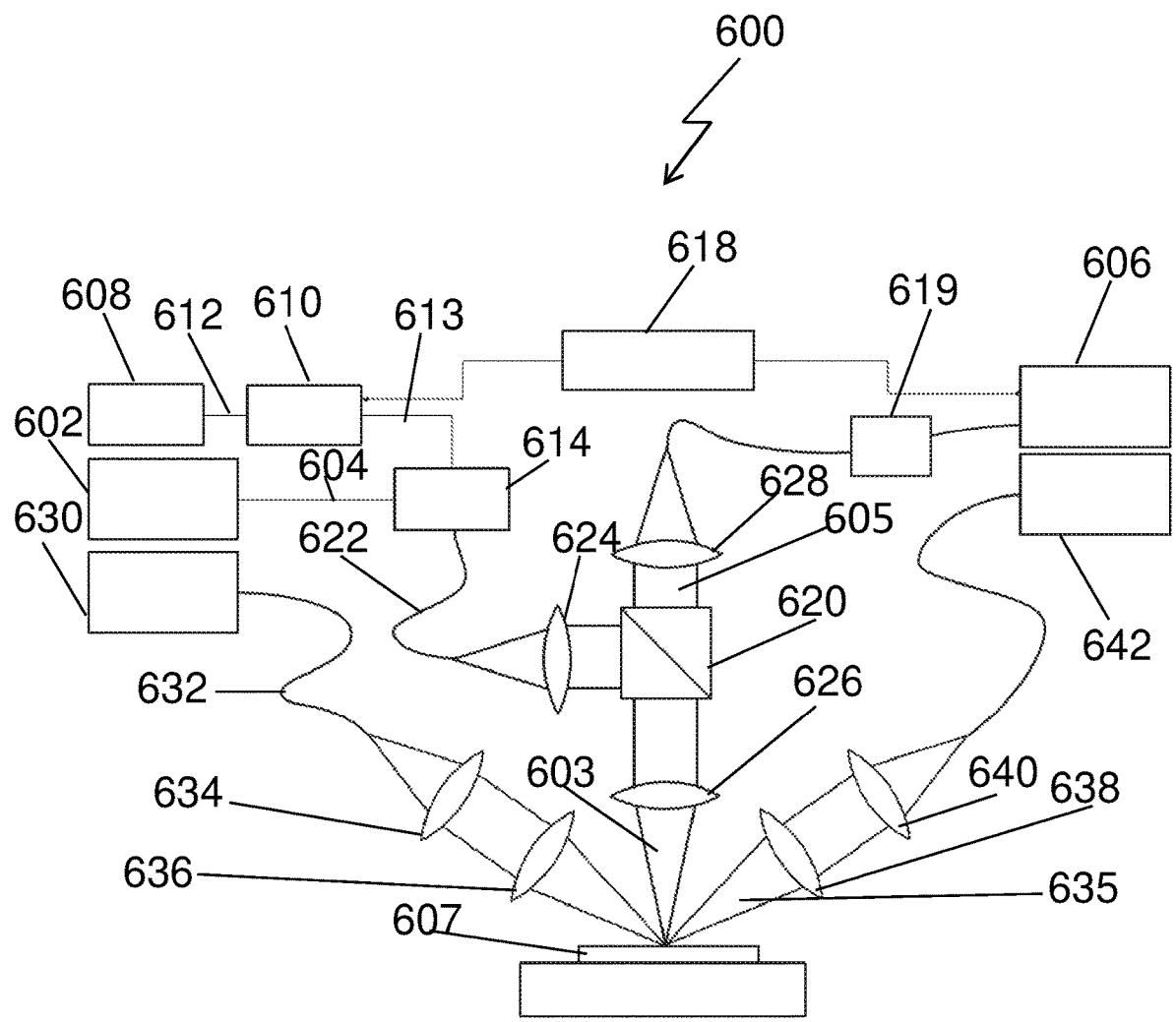
FIG. 6 illustrates a combined OCD set-up and Photoreflectance (PR) spectroscopy apparatus for measuring optical properties of a target sample via a first probe beam configured in a direction normal to the target sample and a second probe beam configured at an oblique angle of incidence onto the target sample in accordance with some embodiments of the present invention.

Colinear: Combining the pump and probe into a co-linear beam as illustrated in FIGS. 5 & 6 below has some advantages, such as removing the need for focus and boresight alignment of the two channels. This however requires that they be separated in some other way, such as:

Polarization: The pump and probe beams can be orthogonally polarized such that a polarized in the collection channel will block the pump beam from reaching the detector.

Spectrally: If the pump WL is sufficiently far from the region of interest in the probe spectrum, it can be separated by a dispersive element in the spectrometer or before it, or if the pump wavelength resides outside the measured spectral range it would not be directly detected.

Temporally: The probe beam can itself be modulated at a different frequency, so that the PR signal is recovered by LID at the sum frequency of the pump and probe modulation while rejecting both the pump itself and other artifacts associated with such as Photoluminescence.

The pump beam can be chosen or controlled so as to alter performance, in several ways:

Wavelength: different wavelengths will affect materials differently according to their band structure and occupancy levels, allowing selective enhancement of sensitivity to different materials in the structure.

Intensity: PR is generally non-linear, since the generated charge carriers affect the band structure which in turn changes the absorption of more photons. By changing the pump beam intensity, these non-linear properties can be probed, providing information on (e.g.) charge carrier lifetime, charge traps and defects.

Polarization: Changing pump polarization can change the absorption profile of the pump beam, highlighting different parts of the structure.

Repetition rate and illumination spot: Since charge carriers are mobile, they diffuse away from the pump spot in a way governed by their lifetime, mean free path, effective mass etc. Changing the temporal and spatial pattern of the pump illumination will affect the PR response in a way that can be linked to these physical parameters. In addition, as soon as the repetition rate becomes comparable with the excited charge carriers' lifetime, the PR signal can strongly depend on the specific repetition rate.

Of course, a proper choice of the 'probe' path properties (wavelength range, polarizations, AOI etc.) would dictate the metrological benefit of this scheme—the parameter sensitivities, correlations and overall performance.

Figure 2:
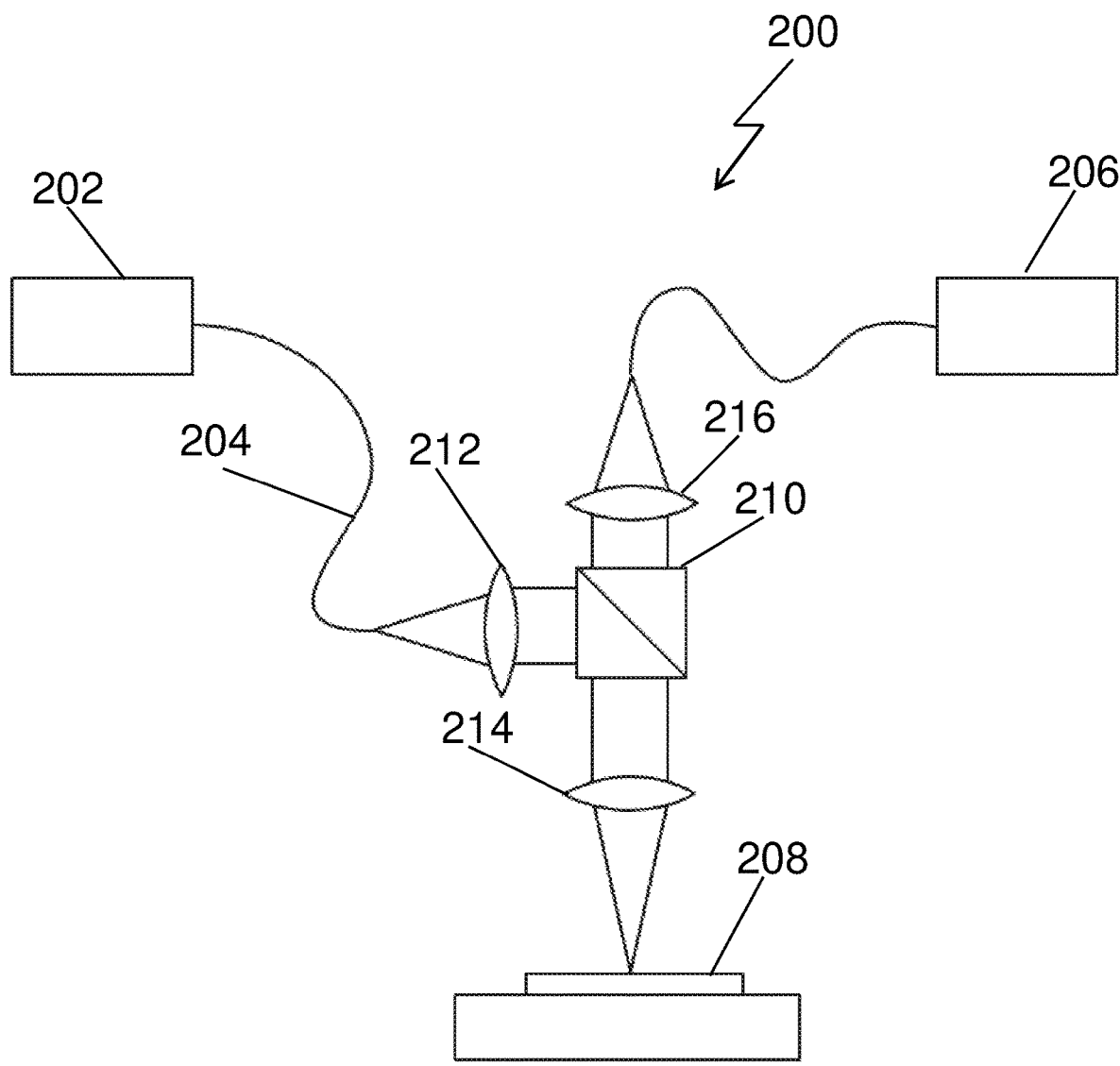
FIG. 2 (PRIOR ART) illustrates an SR OCD apparatus having a normal incidence channel for measuring optical properties of a target sample.

FIG. 2 (PRIOR ART) illustrates an SR OCD apparatus 200 having a normal incidence channel for measuring optical properties of a target sample. In accordance with some embodiments of the present invention, the OCD apparatus 200 is used for measuring optical properties of a target sample 208 via a probe beam 204 configured in a direction normal to the target sample 208. The OCD apparatus 200 comprises a probe source 202 for producing a probe beam 204, and a spectrometer 206 for measuring the spectral components of a beam reflected from a target sample 208. The OCD apparatus 200 further comprises an optical element 210 such as a beam splitter, a mirror and the like and multiple lenses, e.g., lens 212, lens 214 and lens 216.

The optical element 210 directing the probe beam 204 onto the target sample 208 and directing the beam reflecting off the target sample 208 to the spectrometer 206.

In accordance with some embodiments of the present invention, lens 212 focuses the probe beam 204 to the optical element 210, lens 214 is a single objective lens serving both illumination and collection as it focuses the beam exiting the optical element 210 to the target sample 208 and the beam reflecting off the target sample 208 to the optical element 210, and lens 216 focuses the beam exiting the optical element 210 to the spectrometer 206.

Thus, while in operation, the probe source 202 generates a continuous probe beam 204 which is focused via lens 212 onto optical element 210. Optical element 210 directs a pre-determined portion of the probe beam 204 onto the target sample 208 via lens 214, the beam reflecting off the target sample 208 is focused via lens 214 onto the optical element 210 and the beam exiting the optical element 210, is focused via the lens 216 into the spectrometer 206.

Thus, while in operation, the probe source 202 generates a continuous probe beam 204 which is focused via lens 212 onto optical element 210. Optical element 210 directs a pre-determined portion of the probe beam 204 onto the target sample 208, and the beam reflecting off the target sample 208 is focused onto the optical element 210 via the lens 214 and into the spectrometer 206 via lens 216.

Figure 3:
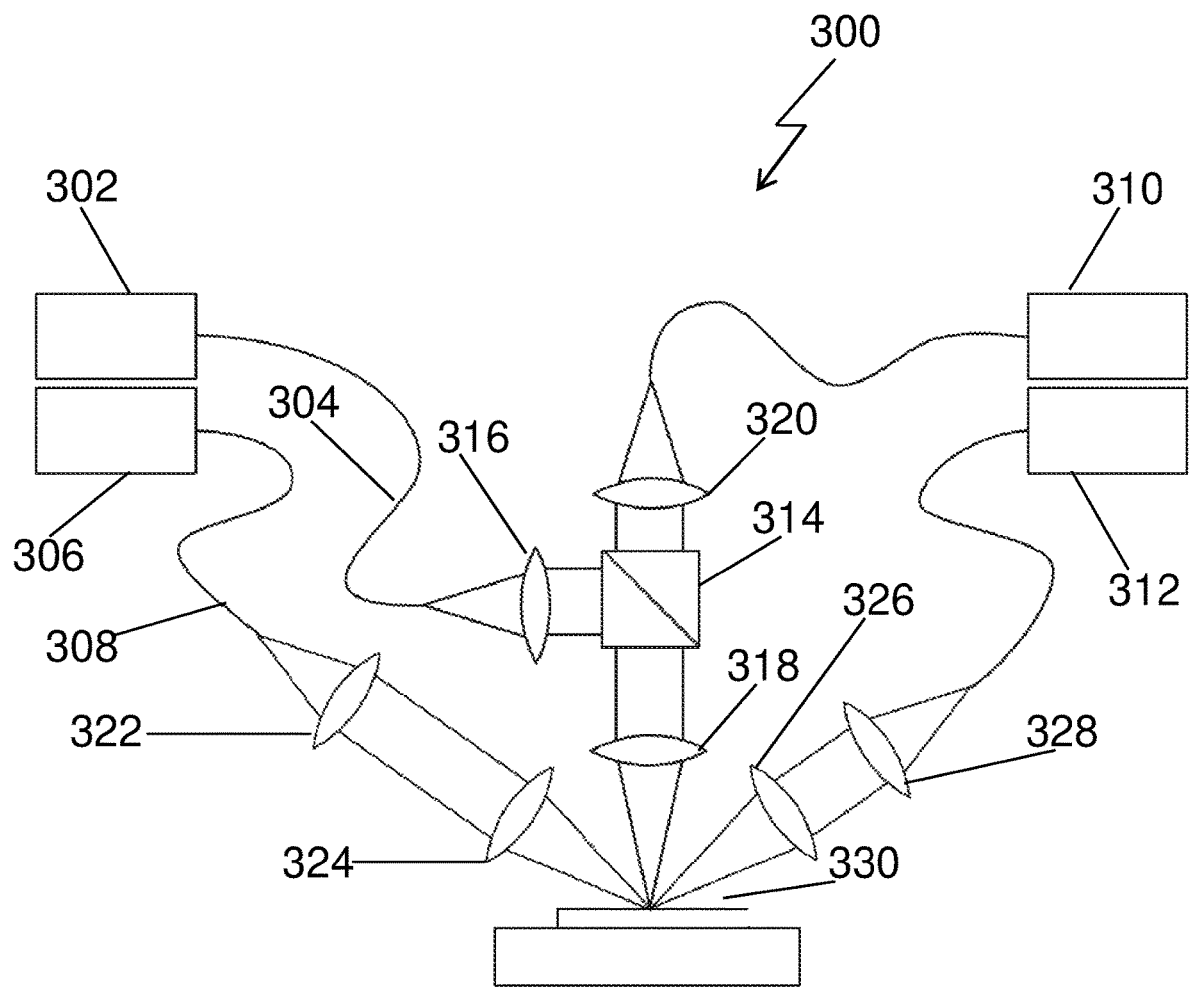
FIG. 3 (PRIOR ART) illustrates a multichannel OCD apparatus having a normal and oblique incidence channels for measuring optical properties of a target sample.

FIG. 3 (PRIOR ART) illustrates a multichannel OCD apparatus 300 having a normal and oblique incidence channels for measuring optical properties of a sample.

In accordance with some embodiments of the present invention, the multichannel OCD apparatus 300 comprises a first probe beam 302 configured in a direction normal to the target sample 330 and a second probe beam 306 configured at an oblique angle of incidence onto the target sample 330 for measuring optical properties of a sample via a combined OCD and photoreflectance system in accordance with some embodiments of the present invention.

In accordance with some embodiments of the present invention, separate objectives are used for the oblique illumination and collection of the reflected beam.

The OCD apparatus 300 further comprises a first spectrometer 310 and a second spectrometer 312 for measuring the spectral components of beams reflected from the target sample 330, an optical element 314 such as a beam splitter, a mirror and the like and multiple focusing members such as lens 316, lens 318, lens 320, lens 322, lens 324, lens 326 and lens 328.

As seen in the figure, the optical element 314 directing the probe beam 304 in a direction normal to the target sample 330 and directing the beam reflecting off the target sample 330 to the first spectrometer 310, and lens 316 focuses the probe beam 304 to the optical element 314, lens 320 focuses the beam exiting the optical element 314 to the first spectrometer 310, and lens 318 is a single objective lens serving both illumination and collection as it focuses the beam exiting the optical element 314 to the target sample 330 and the beam reflecting off the target sample 313 to the optical element 314.

The second probe source 306 produces a second probe beam 308 which is directed at an oblique angle of incidence onto the target sample 330. The second probe beam 308 is focused onto the target sample 330 via lenses 322 and 324, and the beam reflected from the sample 330 is focused via lenses 326 and 328 onto the second spectrometer 312.

Thus, while in operation, the first probe source 302 and the second probe source 306 generate continuous probe beams 304 and 308 continuously. Probe beam 304 is focused via lens 316 onto optical element 314. Optical element 314 directs a pre-determined portion of the probe beam 304 in a direction normal to the target sample 330, and the beam reflecting off the target sample 330 is focused onto the optical element 314 via the lens 318 and into the first spectrometer 210 via lens 320.

The second probe beam 308 is directed at an oblique angle of incidence onto the target sample 330. The second probe beam 308 is focused onto the target sample 330 via lenses 322 and 324, and the beam reflected from the target sample 330 is focused via lenses 326 and 328 onto the second spectrometer 312.

As the spectral reflectivity of a material is closely related to electronic properties such as band structure, density of states, free carries etc., modulation spectroscopy (MS) is uniquely sensitive to these properties more than any other optical spectroscopy method. This can be of high value when electrical testing of semiconductor devices needs to be done at the early stages of their fabrication process, where conventional E-testing s impossible.

The following figures illustrate combined OCD and photoreflectance (PR) systems suitable to the shrinking dimensions and increasing geometric and material complexity encountered in advanced semiconductor technology nodes in accordance with some embodiments of the present invention.

Figure 4:
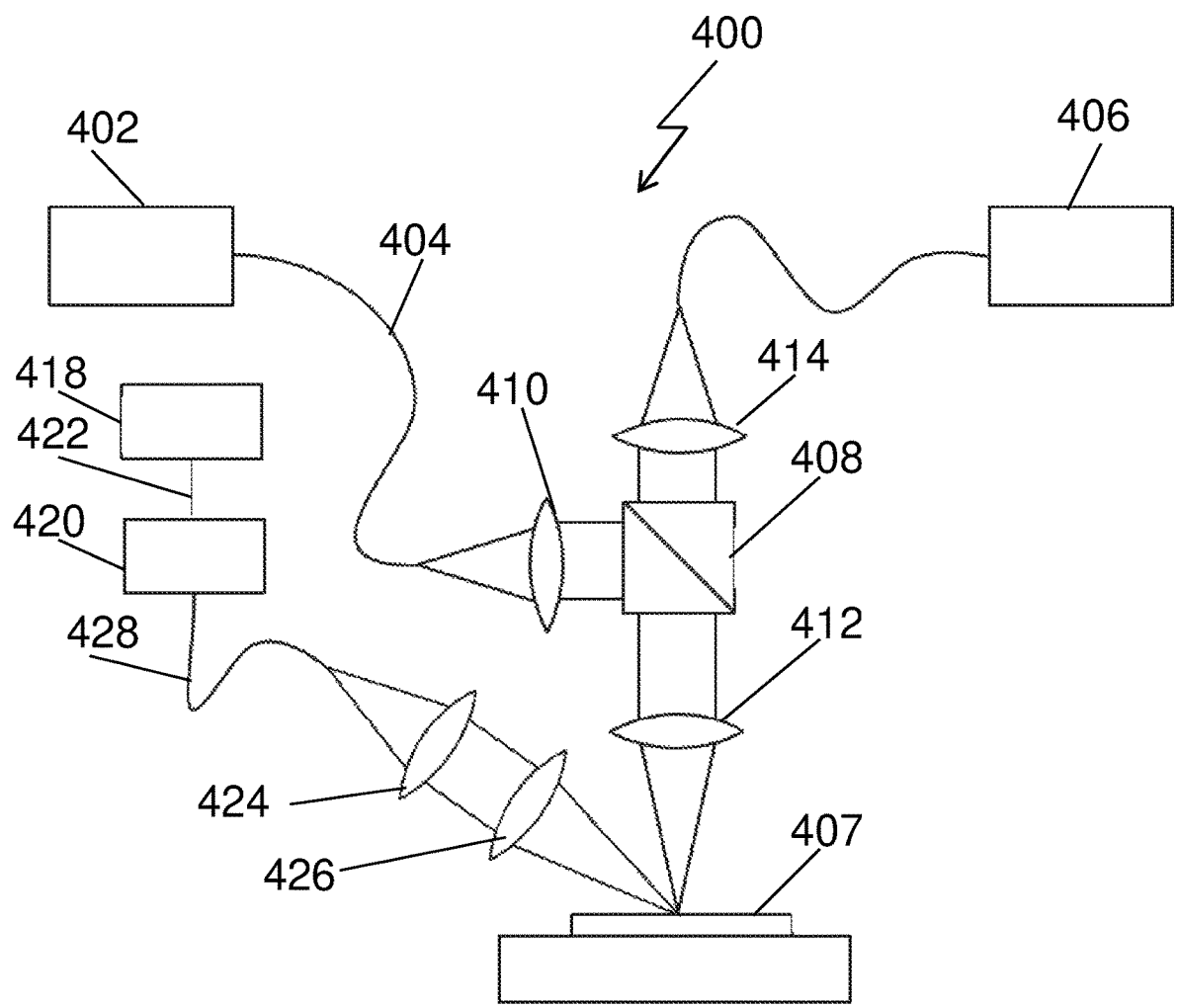
FIG. 4 illustrates a combined OCD and Photoreflectance (PR) spectroscopy apparatus in accordance with some embodiments of the present invention.

FIG. 4 illustrates a combined OCD and Photoreflectance (PR) spectroscopy apparatus 400 in accordance with some embodiments of the present invention.

The OCD set up comprises a probe source 402 for producing a probe beam 404, and a spectrometer 406 for measuring the spectral components of a beam reflecting off a target sample 407. The OCD set up further comprises an optical element 408 such as a beam splitter, a mirror and the like and focusing members such as lens 410, lens 412 and lens 414 for focusing the probe beam 404 to the optical element 408, for focusing the beam exiting the optical element 408 to the target sample 407, and the beam reflecting off the target sample 407 to the spectrometer 406 respectively. Lens 412 is a single objective lens serving both illumination and collection as it focuses the beam exiting the optical element 408 to the target sample 407 and the beam reflecting off the target sample 407 to the optical element 408.

In accordance with some embodiments of the present invention, the Photoreflectance (PR) spectroscopy set up comprises a pump laser 418, a modulator 420 in the path of the laser beam 422 and at least one optical member such as lens 424 and lens 426 for focusing the modulated laser beam 428 onto the target sample 407.

In accordance with some embodiments of the present invention, the laser beam 422 is modulated in order to alternatingly modulate the reflectivity of the sample 407 and thus to have a "pump on" light beam and a "pump off" light beam reflecting off the sample 407.

In accordance with some embodiments of the present invention, the laser beam 422 may be attenuated electronically or via appropriate attenuation optical filters, e.g., mechanically shiftable into/out optical path of pump beam and/or based on electro-optical means, etc.

While in operation, the probe source 402 generates a continuous probe beam 404 which is focused via lens 410 onto optical element 408. Optical element 408 directs a pre-determined portion of the probe beam 404 onto the target sample 407, and the beam reflecting off the target sample 407 is focused onto the optical element 408 via the lens 412 and into the spectrometer 406 via lens 414.

In accordance with some embodiments of the present invention, the modulator 420 alternatingly directs the pump beam 422 to the target sample 407, and thus, alternatingly modulates the reflectivity of the target sample 407.

Thus, in accordance with some embodiments of the present invention, there are two modes in measurements, one while the modulated laser beam 428 is reaching the target sample 407 and another while the modulated laser beam 428 is shuttered out.

While the laser beam 422 is reaching the target sample 407, the light beam reflecting off the target sample 407 is a "pump-on" beam, and when the laser beam 422 is shuttered out, the light beam reflecting off the target sample 407 is a "pump-off" beam.

Thus, such combined OCD and Photoreflectance (PR) spectroscopy apparatus 400 allows measuring alternatingly (a) the spectral reflectivity of the target sample 407, and (b) the modulated reflectivity of the target sample 407, e.g., the change in spectrum rather than the spectrum itself as a response to that perturbation.

FIG. 5 illustrates an alternative combined OCD and Photoreflectance (PR) spectroscopy apparatus 500 in accordance with some embodiments of the present invention.

The alternative combined OCD and Photoreflectance (PR) spectroscopy apparatus 500 is more compact compared to the apparatus illustrated and described in FIG. 4, and therefore, may be suitable for use in spaces limited in size, for instance in semiconductor manufacturing equipment such as coating devices and the like.

In accordance with some embodiments of the present invention, the alternative combined OCD and Photoreflectance (PR) spectroscopy apparatus 500 is comprised of a probe source 502 for producing a probe beam 504, and a spectrometer 506 for measuring the spectral components of a beam reflected from a target sample 507. The alternative combined OCD and Photoreflectance (PR) spectroscopy apparatus 500 further comprises a pump laser 508, a modulator 510 in the path of the laser beam 512, a combiner 514, a notch filter/polarizer 516 and electronics 518.

In accordance with some embodiments of the present invention, the laser beam 512 is modulated in order to alternatingly modulate the reflectivity of the target sample 507 and thus to have a "pump on" light beam and a "pump off" light beam reflecting off the target sample 507.

The alternative combined OCD and Photoreflectance (PR) spectroscopy system 500 further comprises an optical element 520 directing a pre-determined portion of the combined beam 522 onto the target sample 507, and multiple optical members such as lens 524, lens 526 and lens 528 for focusing the combined beam onto the optical element 520, onto the target sample 507 and into the notch filter/polarizer 516 respectively.

In contrast to the OCD and Photoreflectance (PR) spectroscopy system 400 of FIG. 4 which uses two separate beams, a probe beam and a pump laser beam, directed to hit a single spot on the target sample, here, the probe beam 504 and the pump laser beam 512 are combined into a single beam that is alternatingly modulated.

The pump laser beam 512 is modulated via modulator 510 and the modulated laser beam 513 is combined via combiner 514 with the probe beam 504 to produce an alternatingly modulated combined beam 522.

The alternatingly modulated combined beam 522 is focused via lens 524 onto optical element 520 which directs a pre-determined portion of the alternatingly modulated combined beam 522 in a direction normal to the target sample 507.

In accordance with some embodiments of the present invention, the beam reflecting off the target sample 507 is focused via lens 526 onto the optical element 520, and the beam 505 exiting the optical element 520 is focused via lens 528 onto notch filter/polarizer 516 prior to entering into the spectrometer 506.

Notch filter/polarizer 516 is used for filtering out the modulated laser beam 513 from the combined beam reflecting off the target sample 507 in order to avoid damage to the spectrometer 506.

In accordance with some embodiments of the present invention, electronics 518 is used for synchronizing the modulator 510 and the spectrometer 506.

FIG. 6 illustrates a combined OCD set-up and Photoreflectance (PR) spectroscopy apparatus 600 for measuring optical properties of a target sample via a first probe beam configured in a direction normal to the target sample and a second probe beam configured at an oblique angle of incidence onto the target sample in accordance with some embodiments of the present invention.

The combined OCD set-up and Photoreflectance (PR) spectroscopy apparatus 600 is comprised of the combined OCD set-up and Photoreflectance (PR) spectroscopy 500 of FIG. 5 and an additional OCD set-up with a probe beam configured at an oblique angle of incidence onto the target sample.

The combined OCD and Photoreflectance (PR) spectroscopy apparatus 600 is compact and may be suitable for use in spaces of limited in size, for instance in semiconductor manufacturing equipment such as coating devices and the like.

In accordance with some embodiments of the present invention, the combined OCD and Photoreflectance (PR) spectroscopy apparatus 600 is comprised of a first probe source 602 for producing a first probe beam 604, and a first spectrometer 606 for measuring the spectral components of a beam reflecting off a target sample 607.

The combined OCD and Photoreflectance (PR) spectroscopy apparatus 600 further comprises a pump laser 608, a modulator 610 in the path of the laser beam 612, a combiner 614 for combining the first probe beam 604 with the modulated laser beam 613 into a combined beam 622, electronics 618, and a notch filter/polarizer 619.

In accordance with some embodiments of the present invention, the laser beam 612 is modulated in order to alternatingly modulate the reflectivity of the target sample 607 and thus to have a "pump on" light beam and a "pump off" light beam reflecting off the target sample 607.

In accordance with some embodiments of the present invention, electronics 618 is used for synchronizing the modulator 610 and the spectrometer 606.

The combined OCD and Photoreflectance (PR) spectroscopy apparatus 600 further comprises an optical element 620 directing a pre-determined portion of the combined beam 622 onto the target sample 607, and multiple optical members such as lens 624, lens 626 and lens 628 for focusing the combined beam onto the optical element 620, onto the target sample 607 and into the notch filter/polarizer respectively 619 prior to entering into the first spectrometer 606.

As in the OCD and Photoreflectance (PR) spectroscopy apparatus 500 of FIG. 5, the probe beam 604 and the modulated laser beam 613 are combined into a single, combined beam 622 that is alternatingly modulated.

The alternatingly modulated combined beam 622 is focused via lens 624 onto optical element 620 which directs a pre-determined portion of the alternatingly modulated combined beam 622 in a direction normal to the target sample 607.

In accordance with some embodiments of the present invention, the beam reflecting off the target sample 607 is focused via lens 626 onto the optical element 620, and the beam 605 exiting the optical element 620 is focused via lens 628 onto notch filter/polarizer 619 prior to entering into the spectrometer 606.

The Notch filter/polarizer 619 is used for filtering out the modulated laser beam 613 from beam 605 in order to avoid damage to the spectrometer 606.

In accordance with some embodiments of the present invention, the second probe source 630 produces a second probe beam 632 directed at an oblique angle of incidence onto the target sample 607. The second probe beam 632 is focused onto the target sample 607 via lenses 634 and 636, and the beam reflecting off the target sample 607 is focused via lenses 638 and 640 onto the second spectrometer 642.

Thus, while in operation, the first probe source 602 and the second probe source 630 generate continuous probe beams 604 and 632 continuously. Probe beam 604 and a modulated laser beam 613 are combined into a combined beam 622 that is alternatingly modulated. The combined beam 622 is focused via lens 624 onto an optical element 620 which directs a pre-determined portion of the combined beam 622 in a direction normal to the target sample 607, and the beam 603 reflecting off the target sample 607 is focused onto the optical element 620 via the lens 626.

The beam 605 exiting the optical element 620 is focused onto the notch filter/polarizer 619 via lens 628 prior to entering into the spectrometer 606.

In accordance with some embodiments of the present invention, the beam 603 reflecting off said target sample 607 is carrying some modulation due to the spectral reflectivity of the target sample 607 that is alternatingly modulated.

In accordance with some embodiments of the present invention, the second probe beam 632 is directed at an oblique angle of incidence onto the target sample 607. The second probe beam 632 is focused onto the target sample 607 via lenses 634 and 636, and the beam reflecting off the target sample 607 is focused via lenses 638 and 640 onto the second spectrometer 642.

In accordance with some embodiments of the present invention, a photoreflectance (PR) spectroscopy system may comprise one of the photoreflectance (PR) spectroscopy apparatus 400, the photoreflectance (PR) spectroscopy apparatus 500 and the photoreflectance (PR) spectroscopy apparatus 600 and a computer.

The photoreflectance (PR) spectroscopy apparatus 400, 500, 600 converts the "pump on" light beam and the "pump off" light beam to a "pump on" signal and a "pump off" signal and transfers the "pump on" signal and the "pump off" signal to a computer where the "pump on" signal corresponding to a spectrum (R) is subtracted from the "pump off" signal corresponding spectrum. (R+ΔR) to get a PR signal ΔR.

Figure 7:
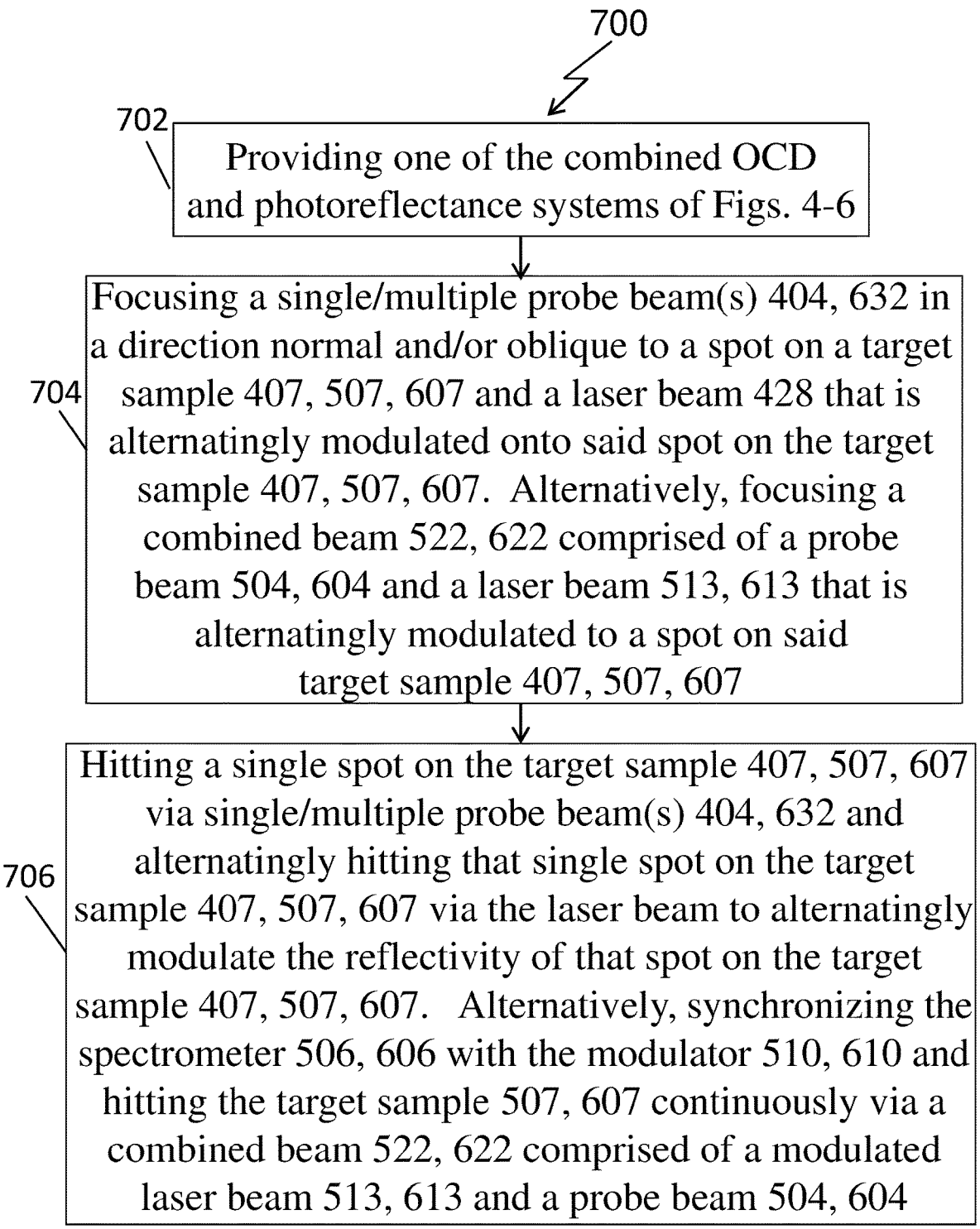
FIG. 7 illustrates a method for measuring optical properties of a target sample via a combined OCD and photoreflectance system in accordance with some embodiments of the present invention.

FIG. 7 illustrates a method 700 for measuring optical properties of a target sample via a combined OCD and photoreflectance system in accordance with some embodiments of the present invention.

The method 700 comprising the following steps:

Step 702: providing one of the above-described combined OCD and photoreflectance systems of FIGS. 4-6;

Step 704: focusing a single/multiple probe beam(s) 404, 632 in a direction normal and/or oblique to a spot on a target sample 407, 507, 607 and a laser beam 428 that is alternatingly modulated onto said spot on the target sample 407, 507, 607.

Alternatively, focusing a combined beam 522, 622 comprised of a probe beam 504, 604 and a laser beam 513, 613 that is alternatingly modulated to a spot on said target sample 407, 507, 607;

Step 706: hitting a single spot on the target sample 407, 507, 607 via single/multiple probe beam(s) 404, 632 and alternatingly hitting that single spot on the target sample 407, 507, 607 via the laser beam to alternatingly modulate the reflectivity of that spot on the target sample 407, 507, 607.

Alternatively, synchronizing the spectrometer 506, 606 with the modulator 510, 610 and hitting the target sample 507, 607 continuously via a combined beam 522, 622 comprised of a modulated laser beam 513, 613 and a probe beam 504, 604;

Step 708: directing the single/multiple light beam(s) (corresponding to the single/multiple probe beam(s)) reflecting off the target sample 407, 507, 607 to at least one spectrometer 406, 506, 606, 642;

Step 710: in case a combined beam 522, 622 comprised of a probe beam 504, 604 and a modulated laser beam 513, 613 is used, filtering out the modulated laser beam 513, 613 from the beam reflecting off the target sample 507, 607 prior to reaching the spectrometer 506, 606;

Step 712: converting the "pump on" light beam and the "pump off" light beam into a "pump on" signal and a "pump off" signal and transferring the "pump on" signal and the "pump off" signal to a computer; and Step 714: subtracting the "pump on" signal corresponding to a spectrum (R) from the "pump off" signal corresponding to a spectrum (R+ΔR) to get a PR signal ΔR.

We claim:

1. A combined OCD and photoreflectance apparatus for improving the OCD performance in measurements of optical properties of a target sample comprising:
   (a) either a single channel OCD set-up comprised of a continuous single probe beam configured in a direction normal/oblique to the target sample or a multichannel OCD set-up having multiple continuous probe beams configured in normal and oblique directions to the target sample for measuring the optical properties of the target sample in said normal direction and/or in said oblique direction;
   (b) at least one laser source for producing at least one laser beam;
   (c) at least one modulation device to turn the at least one laser beam into at least one alternatingly modulated laser beam, and thus, to allow said at least one alternatingly modulated laser beam to alternatingly modulate the spectral reflectivity of the target sample, so that, at least one light beam reflecting off said target sample is alternatingly a "pump on" light beam and a "pump off" light beam; and
   (d) at least one spectrometer for measuring spectral components of the at least one light beam reflecting off said target sample;
   wherein said at least one light beam that is reflecting off the target sample is directed into said at least one spectrometer, and wherein said at least one alternatingly modulated laser beam is alternatingly modulating the spectral reflectivity of the target sample; and
   wherein the combined OCD and photoreflectance apparatus is configured to:
      operate in first measurement mode for providing OCD related measurements related to spectral components of the at least one light beam reflecting off said target sample when the light beam reflecting on the sample is the "pump off" light beam, and
      operate in a second measurement mode providing photoreflectance related measurements related to a difference between (a) spectral components of the at least one light beam reflecting off said target sample when the light beam reflecting on the sample is the "pump off" light beam, and (b) spectral components of the at least one light beam reflecting off said target sample when the light beam reflecting on the sample is the "pump on" light beam.

2. The combined OCD and photoreflectance apparatus of claim 1, wherein said at least one modulating device directly modulating the at least one laser source or in a path of said at least one laser beam to produce at least one modulated laser beam.

3. The combined OCD and photoreflectance apparatus of claim 2, further comprises an optical element directing a pre-determined portion of either the single probe beam or at least one of the multiple probe beams onto the target sample.

4. The combined OCD and photoreflectance apparatus of claim 1, wherein the single/multiple probe beam(s) and the laser beam are directed to hit a single spot on said target sample.

5. The combined OCD and photoreflectance apparatus of claim 4, further comprises an optical element directing a pre-determined portion of either the single probe beam or at least one of the multiple probe beams onto the target sample.

6. The combined OCD and photoreflectance apparatus of claim 1, further comprises an optical element directing a pre-determined portion of either the single probe beam or at least one of the multiple probe beams onto the target sample.

7. The combined OCD and photoreflectance apparatus of claim 6, wherein said optical element is selected from a beam splitter and a mirror.

8. The combined OCD and photoreflectance apparatus of claim 1, wherein said multi-channel OCD set-up is comprised of a first probe beam configured in a direction normal to the target sample and a second probe beam configured in a direction that is oblique to the target sample.

9. The combined OCD and photoreflectance apparatus of claim 8, further comprises an optical element directing a pre-determined portion of either the single probe beam or at least one of the multiple probe beams onto the target sample.

10. A combined OCD and photoreflectance apparatus for improving the OCD performance in measurements of optical properties of a target sample comprising:
   (a) either a single channel OCD set-up comprised of a single probe beam configured in a direction normal/oblique to the target sample or a multichannel OCD set-up having multiple probe beams configured in normal and oblique directions to the target sample for measuring the optical properties of the target sample in said normal direction and/or in said oblique direction;
   (b) at least one laser source for producing at least one laser beam;
   (c) at least one modulation device to turn the at least one laser beam into at least one alternatingly modulated laser beam, and thus, to allow said alternatingly modulated laser beam to alternatingly modulate the spectral reflectivity of the target sample, so that, at least one light beam reflecting off said target sample is alternatingly a "pump on" light beam and a "pump off" light beam; and
   (d) at least one spectrometer for measuring spectral components of the at least one light beam reflecting off said target sample;
   wherein said at least one light beam that is reflecting off the target sample is directed into said at least one spectrometer, and wherein said at least one alternatingly modulated laser beam is alternatingly modulating the spectral reflectivity of the target sample;
   wherein the combined OCD and photoreflectance apparatus is configured to:
      operate in first measurement mode for providing OCD related measurements related to spectral components of the at least one light beam reflecting off said target sample when the light beam reflecting on the sample is the "pump off" light beam; and operate in a second measurement mode providing photoreflectance related measurements related to a difference between (a) spectral components of the at least one light beam reflecting off said target sample when the light beam reflecting on the sample is the "pump off" light beam, and (b) spectral components of the at least one light beam reflecting off said target sample when the light beam reflecting on the sample is the "pump on" light beam.

11. The combined OCD and photoreflectance apparatus of claim 10, further comprises an optical element directing a pre-determined portion of the combined beam onto the target sample.

12. The combined OCD and photoreflectance apparatus of claim 11, wherein said optical element is selected from a beam splitter and a mirror.

13. The combined OCD and photoreflectance apparatus of claim 10 further comprising a notch filter/polarizer for filtering out the modulated laser beam from a combined beam reflecting off the target sample prior to entering into the spectrometer.

14. The combined OCD and photoreflectance apparatus of claim 13, further comprises an optical element directing a pre-determined portion of the combined beam onto the target sample.

15. The combined OCD and photoreflectance apparatus of claim 14, wherein said optical element is selected from a beam splitter and a mirror.

* * * * *